(12) United States Patent
Bai et al.

(10) Patent No.: US 11,765,961 B2
(45) Date of Patent: Sep. 19, 2023

(54) MASK PLATE WITH TRANSITION REGION AND FABRICATING METHOD THEREOF

(71) Applicant: BOE TECHNOLOGY GROUP CO., LTD., Beijing (CN)

(72) Inventors: Shanshan Bai, Beijing (CN); Yansong Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 198 days.

(21) Appl. No.: 17/355,399

(22) Filed: Jun. 23, 2021

(65) Prior Publication Data

US 2022/0131074 A1 Apr. 28, 2022

(30) Foreign Application Priority Data

Oct. 27, 2020 (CN) .......................... 202011160570.9

(51) Int. Cl.
*H10K 71/16* (2023.01)
*H10K 71/00* (2023.01)
(Continued)

(52) U.S. Cl.
CPC ........... *H10K 71/166* (2023.02); *H10K 71/00* (2023.02); *H10K 71/20* (2023.02); *H10K 2102/351* (2023.02)

(58) Field of Classification Search
CPC .................................................. H10K 71/166
See application file for complete search history.

(56) References Cited

U.S. PATENT DOCUMENTS 8,881,676 B2 * 11/2014 Hong .................... H10K 71/00
118/504
8,915,213 B2 * 12/2014 Park ....................... C23C 14/042
118/721
(Continued)

FOREIGN PATENT DOCUMENTS

CN 105511221 A 4/2016
CN 109778116 A 5/2019
(Continued)

OTHER PUBLICATIONS

China Patent Office, CN202011160570.9 First Office Action dated May 7, 2022.

*Primary Examiner* — Caleb E Henry
(74) *Attorney, Agent, or Firm* — HOUTTEMAN LAW LLC (57) ABSTRACT

The present disclosure provides a mask plate and a fabricating method thereof. The mask plate includes a patterning layer having a plurality of openings; a bonding region at a periphery of the patterning region and including a bonding part configured to be bonded to an external frame; and a transition region between the patterning region and the bonding region and including a transition part, the transition part adjoining the patterning layer and the bonding part, respectively; a thickness of the patterning layer is less than a thickness of the bonding part; and a thickness of a portion of the transition part adjoining the patterning layer is less than a thickness of a portion of the transition part adjoining the bonding part. The mask plate of the present disclosure can alleviate problem that the patterning layer is thin and easy to deform and has improved flatness of the patterning layer.

17 Claims, 5 Drawing Sheets

(51) Int. Cl.
*H10K 71/20* (2023.01)
*H10K 102/00* (2023.01)

(56) References Cited

U.S. PATENT DOCUMENTS

| | | | | |
|---|---|---|---|---|
| 9,346,078 | B2* | 5/2016 | Oh | B05C 21/005 |
| 9,567,662 | B2* | 2/2017 | Kim | C23C 14/042 |
| 9,711,724 | B2* | 7/2017 | Baek | C23C 14/042 |
| 10,128,440 | B2* | 11/2018 | Lee | H10K 71/166 |
| 10,301,715 | B2* | 5/2019 | Yoo | B23K 26/24 |
| 10,396,282 | B2* | 8/2019 | Lee | H10K 71/166 |
| 2004/0020435 | A1* | 2/2004 | Tsuchiya | C23C 14/042 |
| | | | | 118/723 VE |
| 2011/0229633 | A1* | 9/2011 | Hong | H10K 71/166 |
| | | | | 118/504 |
| 2012/0266813 | A1* | 10/2012 | Hong | H10K 71/00 |
| | | | | 118/504 |
| 2014/0150721 | A1* | 6/2014 | Oh | C23C 14/042 |
| | | | | 118/504 |
| 2015/0027367 | A1* | 1/2015 | Hong | C23C 14/04 |
| | | | | 118/505 |
| 2015/0028317 | A1* | 1/2015 | Ichihara | H10K 50/854 |
| | | | | 257/40 |
| 2016/0026089 | A1* | 1/2016 | Chen | C23C 14/042 |
| | | | | 118/504 |
| 2018/0083193 | A1* | 3/2018 | Kim | H10K 71/164 |
| 2018/0148823 | A1* | 5/2018 | Yoo | B23K 26/24 |
| 2018/0148844 | A1* | 5/2018 | Yoo | B23K 26/28 |
| 2019/0237708 | A1* | 8/2019 | Yi | H10K 71/164 |
| 2019/0368025 | A1* | 12/2019 | Kim | G03F 7/2063 |

FOREIGN PATENT DOCUMENTS

| | | |
|---|---|---|
| CN | 110724906 A | 1/2020 |
| CN | 110729337 A | 1/2020 |
| CN | 110760794 A | 2/2020 |
| CN | 110970576 A | 4/2020 |
| CN | 211546648 U | 9/2020 |
| JP | 2005347777 A | 12/2005 |

* cited by examiner

FIG. 4G form a patterning layer, a first bonding sub-layer, and a first transition sub-layer using at least one of a nickel-iron alloy, an iron-cobalt alloy, and a nickel-cobalt alloy such that the patterning layer, the first bonding sub-layer, and the first transition sub-layer are disposed in the same layer and the first transition sub-layer is on the periphery of the patterning layer, the first bonding sub-layer is on the periphery of the first transition sub-layer, and the first transition sub-layer is disposed between the patterning layer and the first bonding sub-layer — S11 form a second bonding sub-layer and a second transition sub-layer respectively on the first bonding sub-layer and the first transition sub-layer on the back surface of the mask plate by using at least one of a nickel-iron alloy, an iron-cobalt alloy, and a nickel-cobalt alloy such that an orthographic projection of an edge of the second transition sub-layer close to the patterning region on the first transition sub-layer is farther away from the patterning layer than an edge of the first transition sub-layer close to the patterning region — S12 form a third bonding sub-layer and a third transition sub-layer respectively on the second bonding sub-layer and the second transition sub-layer on the back surface of the mask plate by using at least one of a nickel-iron alloy, an iron-cobalt alloy, and a nickel-cobalt alloy such that an orthographic projection of an edge of the third transition sub-layer close to the patterning layer on the first transition sub-layer is farther away from the patterning layer than the orthographic projection of the edge of the second transition sub-layer close to the patterning layer on the first transition sub-layer — S13 form a fourth bonding sub-layer and a fourth transition sub-layer respectively on the third bonding sub-layer and the third transition sub-layer on the back surface of the mask plate by using at least one of a nickel-iron alloy, an iron-cobalt alloy, and a nickel-cobalt alloy such that an orthographic projection of an edge of the fourth transition sub-layer close to the patterning layer on the first transition sub-layer is farther away from the patterning layer than the orthographic projection of the edge of the third transition sub-layer close to the patterning layer on the first transition sub-layer — S14

FIG. 5

MASK PLATE WITH TRANSITION REGION AND FABRICATING METHOD THEREOF

CROSS-REFERENCE TO RELATED APPLICATION

This application claims priority to Chinese Patent Application No. 202011160570.9 filed on Oct. 27, 2020, the entire contents of which are hereby incorporated by reference.

TECHNICAL FIELD

The present disclosure relates to the field of semiconductor technology, in particular to a mask plate and a fabricating method thereof.

BACKGROUND

The organic light-emitting material in a small-sized OLED display panel is generally prepared by a vacuum evaporation process. The high-resolution RGB pixel pattern in the display panel is formed by an evaporation process using a fine metal mask plate, and the precise opening pattern of the metal mask plate ensure that the organic light-emitting material is precisely and controllably evaporated on a substrate. At present, a metal mask plate made of Invar and produced by a wet etching process is generally adopted in mass production in the display industry, and the metal mask plate usually has a thickness of 25 μm to 40 μm. Due to the limitation of the conventional wet etching process, the display limit that can be achieved is 600 PPI to 700 PPI, and a metal mask plate with a thickness less than 20 μm can hardly be fabricated and cannot be produced in mass. The electroforming process is to form a film by utilizing electrochemical deposition principle and can accurately control the size and the thickness of the film, and the bottleneck of the etching process can be broken through by utilizing the characteristics of the electroforming process, so that the size of an opening is smaller, and the thickness of the mask plate is smaller. As a result, the evaporation shadow is reduced, and a high-resolution product with a resolution higher than 800 PPI is realized. However, the metal mask plate fabricated by the electroforming process has the disadvantages that the formed metal mask plate is extremely thin and is easy to wrinkle and deform, and when the metal mask plate with the thickness less than 20 μm is welded to a frame, the welding process is difficult, and situations of breakdown, insufficient welding, loose welding, and poor flatness that may cause welding failure easily occur.

SUMMARY

In an aspect, embodiments of the present disclosure provides a mask plate including: a patterning region including a patterning layer having a plurality of openings; a bonding region at a periphery of the patterning region and including a bonding part configured to be bonded to an external frame; and a transition region between the patterning region and the bonding region and including a transition part, the transition part adjoining the patterning layer and the bonding part, respectively; wherein a thickness of the patterning layer is less than a thickness of the bonding part; and a thickness of a portion of the transition part adjoining the patterning layer is less than a thickness of a portion of the transition part adjoining the bonding part.

In an embodiment, the thickness of the transition part increases stepwise in a direction from the patterning region to the bonding region.

In an embodiment, the bonding part and the transition part are each of a multi-layer structure.

In an embodiment, the bonding part includes a first bonding sub-layer and a second bonding sub-layer; the transition part includes a first transition sub-layer and a second transition sub-layer; the first bonding sub-layer, the first transition sub-layer, and the patterning layer are flush with each other, and the first transition sub-layer is between and in contact with the first bonding sub-layer and the patterning layer, respectively; the second bonding sub-layer and the second transition sub-layer are positioned on one sides of the first bonding sub-layer and the first transition sub-layer, respectively; and an orthographic projection, on the first transition sub-layer, of an inner edge of the second transition sub-layer close to the patterning layer is farther away from the patterning layer than an inner edge of the first transition sub-layer close to the patterning layer.

In an embodiment, the bonding part further includes a third bonding sub-layer on a surface of the second bonding sub-layer away from the first bonding sub-layer; the transition part further includes a third transition sub-layer on a surface of the second transition sub-layer away from the first transition sub-layer; and an orthographic projection, on the first transition sub-layer, of an inner edge of the third transition sub-layer close to the patterning layer is farther away from the patterning layer than the orthographic projection, on the first transition sub-layer, of the inner edge of the second transition sub-layer close to the patterning layer.

In an embodiment, the bonding part further includes a fourth bonding sub-layer on a surface of the third bonding sub-layer away from the second bonding sub-layer; the transition part further includes a fourth transition sub-layer on a surface of the third transition sub-layer away from the second transition sub-layer; and an orthographic projection, on the first transition sub-layer, of an inner edge of the fourth transition sub-layer close to the patterning layer is farther away from the patterning layer than the orthographic projection, on the first transition sub-layer, of the inner edge of the third transition sub-layer close to the patterning layer.

In an embodiment, the second bonding sub-layer and the second transition sub-layer are of a single-piece structure; the third bonding sub-layer and the third transition sub-layer are of a single-piece structure; and the fourth bonding sub-layer and the fourth transition sub-layer are of a single-piece structure.

In an embodiment, the thickness of the patterning layer is in the range of 5 μm to 12 μm; and/or the thickness of the bonding part is in the range of 15 μm to 25 μm, and the thickness of the portion of the transition part adjoining the bonding part is in the range of 15 μm to 25 μm.

In an embodiment, a material of any one of the patterning layer, the first bonding sub-layer, the second bonding sub-layer, the third bonding sub-layer, the fourth bonding sub-layer, the first transition sub-layer, the second transition sub-layer, the third transition sub-layer, and the fourth transition sub-layer is at least one of a nickel-iron alloy, an iron-cobalt alloy, and a nickel-cobalt alloy.

In an embodiment, the inner edge of the second transition sub-layer has a plurality of protrusions protruding toward the patterning region and a plurality of recesses recessed toward the bonding region.

In an embodiment, the plurality of protrusions include a plurality of first semicircles, and lines respectively connecting diameters of the plurality of first semicircles are on a first straight line; the plurality of recesses include a plurality of second semicircles, and lines respectively connecting diameters of the plurality of second semicircles are on a second straight line; and the plurality of first semicircles and the plurality of second semicircles are alternately arranged and connected in sequence.

In an embodiment, the first straight line and the second straight line are the same line; and the diameter of the first semicircle is 1.7 to 2 times the diameter of the second semicircle.

In an embodiment, the diameter of the first semicircle is in the range of 200 μm to 400 μm.

In an embodiment, the plurality of protrusions include a plurality of first triangles or trapezoids, and lines respectively connecting bases of the plurality of first triangles or trapezoids are on a first straight line; the plurality of recesses include a plurality of second triangles or trapezoids, and lines respectively connecting bases of the plurality of second triangles or trapezoids are on a second straight line; and the plurality of first triangles or trapezoid and the plurality of second triangles or trapezoids are alternately arranged and connected in sequence.

In an embodiment, the inner edge of the third transition sub-layer and/or the inner edge of the fourth transition sub-layer has a plurality of protrusions protruding towards the patterning region and a plurality of recesses recessed towards the bonding region.

In another aspect, the embodiments of the present disclosure further provide a fabricating method of the mask plate, including:

forming the patterning layer having a plurality of openings in the patterning region;

forming, in the bonding region, the bonding part configured to be bonded to an external frame; and forming the transition part in the transition region, the transition part adjoining the patterning layer and the bonding part, respectively;

wherein a thickness of the patterning layer is less than a thickness of the bonding part; and a thickness of a portion of the transition part adjoining the patterning layer is less than a thickness of a portion of the transition part adjoining the bonding part.

In an embodiment, a fabricating method of the mask plate includes: forming the patterning layer, the first bonding sub-layer, the first transition sub-layer by a same electrochemical deposition process; and forming the second bonding sub-layer and the second transition sub-layer by a same electrochemical deposition process.

In an embodiment, a method for manufacturing the mask plate includes: forming the patterning layer, the first bonding sub-layer, and the first transition sub-layer by a same electrochemical deposition process; forming the second bonding sub-layer and the second transition sub-layer by a same electrochemical deposition process; forming the third bonding sub-layer and the third transition sub-layer by a same electrochemical deposition process; and forming the fourth bonding sub-layer and the fourth transition sub-layer by a same electrochemical deposition process.

The mask plate provided by the present disclosure includes a patterning region, a bonding region and a transition region, the patterning region usually includes a single-piece film layer with smaller thickness, and the bonding region to be bonded to a frame usually adopts a multi-layer structure with larger thickness, so that deformation of the film in the patterning region is reduced to improve the flatness of the mask plate, the stability of the mask plate is improved, and stable welding is ensured. In addition, a transition region is additionally provided between the patterning region and the thickened bonding region. In the thickness direction of the transition region, the first transition sub-layer and the patterning layer in the patterning region are flush with each other, a second transition sub-layer, a third transition sub-layer and a fourth transition sub-layer are additionally provided in the transition region as a first compensation layer, a second compensation layer and a third compensation layer, the second transition sub-layer, as first compensation layer, has an edge provided with a plurality of protrusions and a plurality of recesses, i.e., wave-like patterns having different sizes and arranged in intervals, in this way, wrinkles and deformation caused by stretching and transverse shrinkage of the mask plate can be effectively resisted. Further, the transition region and the bonding region are subjected to multi-layer deposition, and orthographic projections of boundaries of a plurality of sub-layers included in the transition region on the first transition sub-layer are gradually farther away from the patterning region, that is, the plurality of sub-layers are arranged in a step shape in a direction perpendicular to the first transition sub-layer. With compensation on thicknesses in divisional regions of the mask plate and design of the pattern of each compensation sub-layer, the problems of wrinkles and poor welding of the electroformed mask plate can be effectively solved.

DETAILED DESCRIPTION

In order to make those skilled in the art better understand the technical solutions of the present disclosure, the present disclosure will be described below in conjunction with the accompanying drawings and specific embodiments. The following detailed description of the present disclosure is provided to enable those skilled in the art to better understand the technical solutions of the present disclosure.

In order to avoid the problem that the thickness of a mask plate fabricated by an electroforming process is so small that wrinkles and deformation are easily formed, the present disclosure provides a mask plate and a fabricating method thereof.

The mask plate provided by the present disclosure is partitioned into: a patterning region located in the central area of the mask plate and provided with a film layer having a plurality of openings for forming a required pattern; a transition region located on the periphery of the patterning region; a bonding region (also referred to as a welding region) located on the periphery of the transition region and reserved as a region for fixing the mask plate to an external frame during evaporation. In the present disclosure, an electroforming process may be used to fabricate a mask plate, and a thickness of a film layer in a core region (i.e., a patterning region including a plurality of openings) of the formed mask plate is small, for example, is 5 μm to 12 μm, which may significantly reduce a shadow effect when performing an evaporation process using a conventional thick metal mask plate, so that a color mixing risk between for example, RGB pixel patterns in a display panel can be reduced, and a pitch between adjacent pixels can be reduced, thereby improving a resolution. The patterning region of the electroformed mask plate of the present application may adopt a single-piece film layer. For example, the patterning region of the electroformed mask includes a single-piece film layer having a plurality of pixel holes uniformly arranged in an array. The electroformed mask plate with this design can realize formation of various patterns in a display panel in conjunction with an auxiliary mask plate, which facilitate achievement of high-resolution patterns, and the single-piece film layer in the patterning region having a plurality of pixel holes uniformly arranged in an array facilitate uniform force applied on the patterning layer during stretching.

The film layer in the patterning region is easy to damage, wrinkle and deform in the evaporation process due to small thickness, so that the mask plate is difficult to be flatly fixed to an outer frame (stretching of the mask plate), breakdown, insufficient soldering, loose soldering and poor flatness that may cause soldering failure are easy to occur. In order to increase the strength and stability of the mask plate and alleviating welding defects, the mask plate in the embodiments of the present disclosure have a thickened film layer in the welding region, for example, the thickness of the film layer in the welding region may be 15 μm to 25 μm, and the thickened film layer may be implemented by forming a plurality of film layers by electrochemical deposition, in other words, the welding region may include a plurality of film layers (i.e., the film layer in the welding region may have a multi-layer structure). The mask plate of the present disclosure further includes a transition region between the patterning region and the bonding region, the transition region also includes a plurality of film layers (i.e., the film layer in the transition region may have a multi-layer structure), the film layers in the transition region may be sequentially formed by a film deposition process similar to the film layers in the welding region, and corresponding film layers in the welding region and the transition region may be formed as a single piece by the film deposition process.

There is a big difference in mechanical tensile property between the film layer, which is relatively thin and has a plurality of openings, in the patterning region of the mask plate and the film layer, which is relatively thick, in the bonding region, therefore, when stretching the mask plate, obvious wrinkles and deformation may occur at the junction of the patterning region and the bonding region, as a result, the position accuracy of pixel openings in the patterning region is shifted after the stretching, RGB pixel patterns generated by an evaporation process are shifted and mixed, and because the mask plate cannot be closely attached to a glass substrate at folds, a significant evaporation shadow effect or even a situation that an organic material cannot be evaporated on the substrate may occur. In order to reduce wrinkles and deformation, the mask plate of the present disclosure is additionally provided with a transition region between the patterning region and the bonding region. The transition region is the region that connects the patterning region and the bonding region. The transition region and the bonding region may be the same in film thickness, and the film layer in the transition region and the film layer in the bonding region are simultaneously formed by an electroforming deposition process as described above. In order to avoid a sudden change in mechanical tensile property from the patterning region to the bonding region, the transition region of the mask plate provided by the embodiments of the present disclosure may include a plurality of film layers, and the plurality of film layers are configured to be arranged in a step shape decreasing from the patterning region to the bonding region (i.e., the overall thickness of the mask plate increases stepwise in the direction from the patterning region to the bonding region), thereby balancing the stress applied on the mask plate and effectively alleviating the wrinkles and deformation of the mask plate.

Figure 2A:
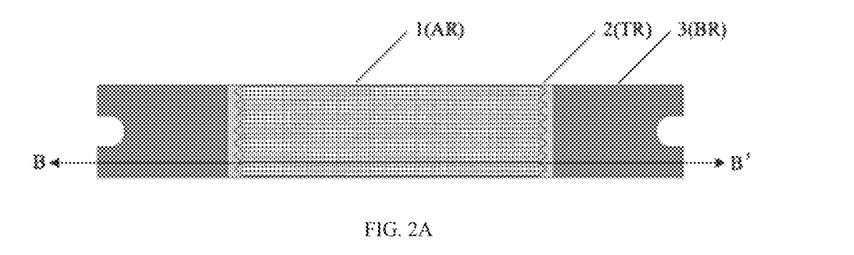
FIGS. 2A and 2B illustrate a top view and a cross-sectional view of a structure of a mask plate according to an embodiment of the present disclosure, respectively.
Figure 2B:
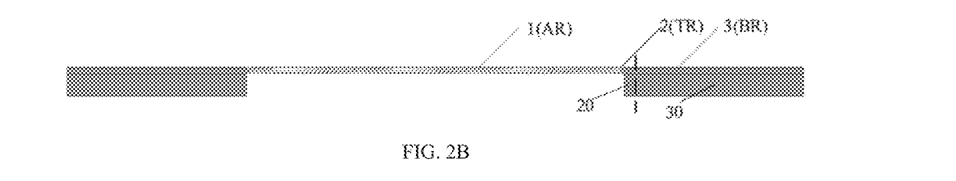

In some embodiments, as shown in FIGS. 2A and 2B, the present disclosure provides a mask plate including: a patterning region AR having a patterning layer 1 including a plurality of openings; a bonding region BR on the periphery of the patterning region AR and having a bonding part 3 configured to be bonded to an external frame; and a transition region TR between the patterning region AR and the bonding region BR and having a transition part 2, the transition part 2 adjoining the patterning layer 1 and the bonding part 3, respectively; a thickness of the patterning layer 1 is smaller than a thickness of the bonding part 3.

The mask plate of the present disclosure may be fabricated by adopting an electroforming process, and a material of the mask plate may be at least one of a nickel-iron alloy, a nickel-cobalt alloy and an iron-cobalt alloy. FIG. 2A shows a schematic view of the front side (a side close to a substrate to be patterned in use) of the mask plate, and FIG. 2B shows a cross-sectional view of the mask plate in a thickness direction taken along line BB' in FIG. 2A. As shown in FIG. 2A, upper surfaces of the patterning layer 1 in the patterning region AR, the transition part 2 in the transition region TR, and the bonding part 3 of the bonding region BR of the mask plate are flush, as shown in FIG. 2A. However, as shown in FIG. 2B, the lower surfaces of the patterning layer 1 of the patterning region AR, the transition part 2 of the transition region TR, and the bonding part 3 of the bonding region BR of the mask are not flush with each other, the thicknesses of the transition part 2 in the transition region TR and the bonding part 3 in the bonding region BR are greater than the thickness of the patterning layer 1 in the patterning region AR. In some embodiments, both the transition part 2 in the transition region TR and the bonding part 3 in the bonding region BR may have a multi-layer structure.

As shown in FIGS. 2A and 2B, the thickness of the patterning layer 1 in the patterning region AR of the mask plate is relatively small, and may be in the range of 5 μm to 12 μm, so that a shadow effect during an evaporation process can be avoided. The bonding part 3 in the bonding region BR of the mask plate additionally includes a bonding compensation film layer 30 for increasing the thickness of the bonding part 3, and the material of the bonding compensation film layer 30 may also be at least one of a nickel-iron alloy, a nickel-cobalt alloy and an iron-cobalt alloy. By adding the bonding compensation film layer 30 in the bonding part 3, the stretching reliability and flatness of the mask plate can be ensured, and then the welding reliability is ensured. The transition part 2 in the transition region TR of the mask plate additionally includes a transition compensation film layer 20 for increasing the thickness of the transition part 2, and the material of the transition compensation film layer 20 may also be at least one of a nickel-iron alloy, a nickel-cobalt alloy and an iron-cobalt alloy. By adding the transition compensation film layer 20 in the transition part 2, a sudden change in mechanical tensile property from the patterning region to the bonding region can be avoided, stretching reliability and flatness of the mask plate can be further ensured, and then the welding reliability is ensure.

Figure 1A:
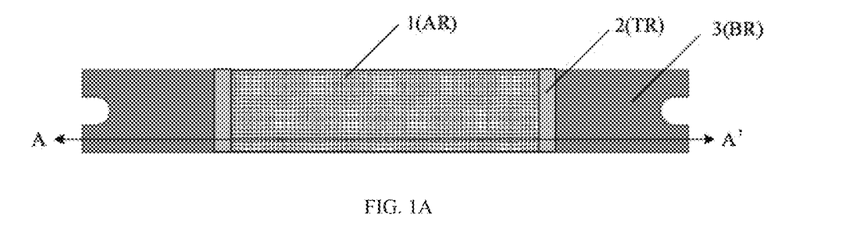
FIGS. 1A and 1B illustrate a top view and a cross-sectional view of a partial structure of a mask plate according to an embodiment of the present disclosure, respectively.
Figure 1B:
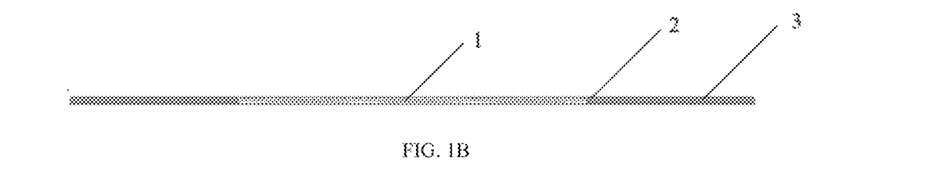
Figure 3:
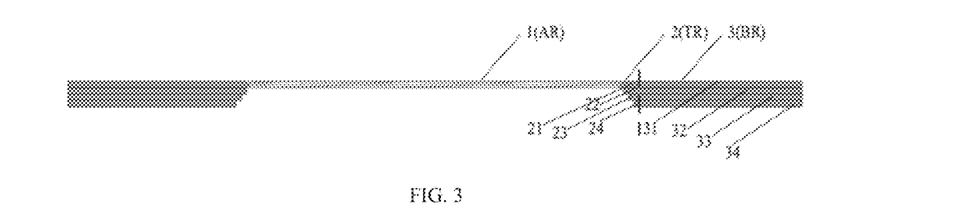
FIG. 3 illustrates a schematic cross-sectional view of a structure of a mask according to an embodiment of the present disclosure.

Hereinafter, a layer closest to a substrate on which a pattern is to be formed during the use of the mask plate is referred to as a first layer. FIGS. 1A and 1B schematically show a schematic diagram and a cross-sectional view of a partial structure (structure of the first layer) of the mask plate. FIG. 1A only shows a schematic diagram of the structure of the first layer of the mask plate. FIG. 1B is a cross-sectional view taken along line AA' of FIG. 1A. As shown in FIGS. 1A and 1B, the patterning layer 1 in the patterning region AR of the mask plate may be arranged in the same layer as the first layer of the transition part 2 in the transition region TR and the first layer of the bonding part 3 in the bonding region BR. That is, one electroforming process may be used to form the first layers in the three regions at the same time. The material of the first layers is, for example, at least one of a nickel-iron alloy, a nickel-cobalt alloy, and an iron-cobalt alloy, and the thickness thereof may be in the range of 5 μm to 12 μm. The patterning layer 1 in the patterning region AR, the first layer of the transition part 2 in the transition region TR, and the first layer of the bonding part 3 in the bonding region BR may have a one-piece structure. FIG. 3 shows a cross-sectional view of a mask plate of an embodiment of the present disclosure. In the embodiment, the transition part 2 in the transition region TR may include a first transition sub-layer 21, a second transition sub-layer 22, a third transition sub-layer 23 and a fourth transition sub-layer 24. The bonding part 3 in the bonding region BR includes a first bonding sub-layer 31, a second bonding sub-layer 32, a third bonding sub-layer 33, a fourth bonding sub-layer 34. As shown in FIG. 3, the thickness of a portion (i.e., a portion of the first transition sub-layer 21 in direct contact with the patterning layer 1) of the transition part 2 adjoining the patterning layer 1 is smaller than the thickness of a portion (i.e., a combination of portions of the first transition sub-layer 21, the second transition sub-layer 22, the third transition sub-layer 23 and the fourth transition sub-layer 24 in direct contact with the bonding part 3) of the transition part 2 adjoining the bonding part 3. The first transition sub-layer 21, the first bonding sub-layer 31, and the patterning layer 1 are flush with each other (for example, the first transition sub-layer 21, the first bonding sub-layer 31, and the patterning layer 1 have substantially the same thickness, and at least the upper surfaces of the first transition sub-layer 21, the first bonding sub-layer 31 and the patterning layer 1 are flush with each other), and may be made of at least one of a nickel-cobalt alloy, a nickel-iron alloy, and an iron-cobalt alloy by the same electroforming process, and the first transition sub-layer 21 is located between the first bonding sub-layer 31 and the patterning layer 1 and is in contact with the first bonding sub-layer 21 and the patterning layer 1, respectively. The second bonding sub-layer 32 and the second transition sub-layer 22 are located on one sides of the first bonding sub-layer 31 and the first transition sub-layer 21, respectively (e.g., respectively on the lower surfaces of the first bonding sub-layer 31 and the first transition sub-layer 21 in FIG. 3), an orthographic projection of a side edge (inner edge) of the second transition sub-layer 22 close to the patterning layer 1 on the first transition sub-layer 21 is farther away from the patterning layer 1 than an edge of the first transition sub-layer 21 in contact with the patterning layer 1; the bonding part 3 further includes a third bonding sub-layer 33 located on a side of the second bonding sub-layer 32 away from the first bonding sub-layer 31; the transition part 2 further includes a third transition sub-layer 23 on a side of the second transition sub-layer 22 away from the first transition sub-layer 21, and an orthographic projection of a side edge (inner edge) of the third transition sub-layer 23 close to the patterning layer 1 on the first transition sub-layer 21 is farther away from the patterning layer 1 than the orthographic projection of the inner edge of the second transition sub-layer 22 close to the patterning layer 1 on the first transition sub-layer 21; the bonding part 3 further includes a fourth bonding sub-layer 34 on a side of the third bonding sub-layer 33 away from the second bonding sub-layer 32; the transition part 2 further includes a fourth transition sub-layer 24 on a side of the third transition sub-layer 23 away from the second transition sub-layer 22, and an orthographic projection of a side edge (inner edge) of the fourth transition sub-layer 24 close to the patterning layer 1 on the first transition sub-layer 21 is farther away from the patterning layer 1 than the orthographic projection of the inner edge of the third transition sub-layer 23 close to the patterning layer 1 on the first transition sub-layer 21. Thus, the first transition sub-layer 21, the second transition sub-layer 22, the third transition sub-layer 23, and the fourth transition sub-layer 24 form, on the back surface of the mask plate opposite to the front surface, a multi-step structure in a direction away from the patterning region AR, so that a sudden change in property between the film layers of the patterning region AR and the bonding region BR can be reduced.

In the embodiment, the second bonding sub-layer 32 and the second transition sub-layer 22 may have a single-piece structure; the third bonding sub-layer 33 and the third transition sub-layer 23 may have a single-piece structure; and the fourth bonding sub-layer 34 and the fourth transition sub-layer 24 may have a single-piece structure. That is, the second bonding sub-layer 32 and the second transition sub-layer 22 are formed by a same electroforming process using at least one of a nickel-iron alloy, an iron-cobalt alloy, and a nickel-cobalt alloy; the third bonding sub-layer 33 and the third transition sub-layer 23 are formed by a same electroforming process using at least one of a nickel-iron alloy, an iron-cobalt alloy, and a nickel-cobalt alloy; the fourth bonding sub-layer 34 and the fourth transition sub-layer 24 are formed by a same electroforming process using at least one of a nickel-iron alloy, an iron-cobalt alloy, and a nickel-cobalt alloy.

In some embodiments, the thickness of patterning layer 1 is in the range of 5 μm to 12 μm; the thickness of the bonding part 3 is in the range of 15 μm to 25 μm, and the thickness of a portion of the transition part 2 in contact with the bonding part 3 is the same as the thickness of the bonding part 3 and is in the range of 15 μm to 25 μm because each film layer of the transition part 2 and corresponding one film layer of the bonding part 3 are formed by the same electrochemical deposition process. Although the transition part 2 and the bonding part 3 have been described as including a two-layer structure or a four-layer structure, the present disclosure is not limited thereto, and the number of the sub-layers included in the transition part 2 or the bonding part may be flexibly set according to actual situations, for example, the transition part 2 and the bonding part 3 may both have a three-layer structure, as long as the overall thicknesses of the transition part 2 and the bonding part 3 are within the above range.

Figures 4A, 4B:
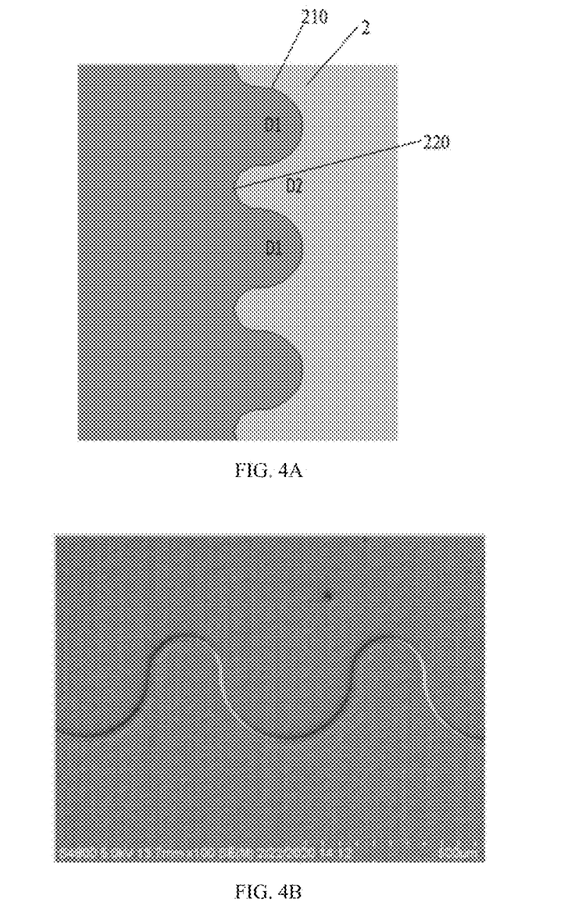
FIGS. 4A and 4B illustrate a schematic structural diagram and a scanning electron microscope diagram of a film layer in a transition region of a mask plate according to an embodiment of the present disclosure, respectively.

As shown in FIGS. 4A and 4B, in order to effectively resist wrinkles and deformation caused by stretching and transverse shrinkage of the mask plate, in an embodiment, the second transition sub-layer 22 of the transition part 2 in the transition region TR is farther away from the patterning layer 1 than the first transition sub-layer 21, and the edge of the second transition sub-layer 22 close to the patterning layer 1 is provided with wave patterns with different sizes arranged at intervals. For example, in the embodiment, the portion of the second transition sub-layer 22 close to the patterning layer 1 has a plurality of protrusions protruding towards the patterning region AR and a plurality of recesses recessed towards the bonding region BR. As shown in FIGS. 4A and 4B, the plurality of protrusions may include a plurality of first semicircles 210, lines respectively connecting diameters D1 of the plurality of first semicircles 210 being on a first straight line; the plurality of recesses may include a plurality of second semicircles 220, lines respectively connecting diameters D2 of the plurality of second semicircles 220 being on a second straight line; the plurality of first semicircles 210 and the plurality of second semicircles 220 are alternately arranged and connected in sequence, thereby forming the wave patterns. The first straight line and the second straight line may be a same line. As an example, the diameter D1 of the first semicircle 210 is about 1.7 to 2 times the diameter D2 of the second semicircle 220. In an embodiment, the diameter D1 of the first semicircle 210 is about 200 μm to 400 μm. With this setting, when welding the mask plate to the frame for an evaporation process, the stress produced during the stretching can be balanced, and is thus uniformly applied to the film layer in the patterning region of the mask plate during the stretching, thereby avoiding wrinkles of the mask plate are avoided, and improving welding quality and welding reliability.

The above is merely an example of the wave patterns in the present disclosure, but the present disclosure is not limited thereto, and for example, the edge of the second transition sub-layer in the transition region of the mask plate may be designed in other shapes as long as the shape allows the film layer of the mask plate to be uniformly stressed during stretching, for example, the plurality of protrusions and the plurality of recesses may be formed by alternately arranging semicircles of four different diameters, semicircles of two different diameters protrude toward the patterning region, and semicircles of the other two different diameters protrude toward the bonding region, and the diameters of the semicircles of the four different diameters all extend in the same direction.

The shape of the wave-like edge of the transition sub-layer is not limited to a circular shape, and may be formed by, for example, a broken line, rectangles, triangles, trapezoids and the like, as long as the shape of the edge of the transition sub-layer enables the film layer of the mask plate to balance stress when the mask plate is stretched, so as to achieve uniform stress on the whole patterning layer, and ensure the welding quality and reliability.

Figure 4C:
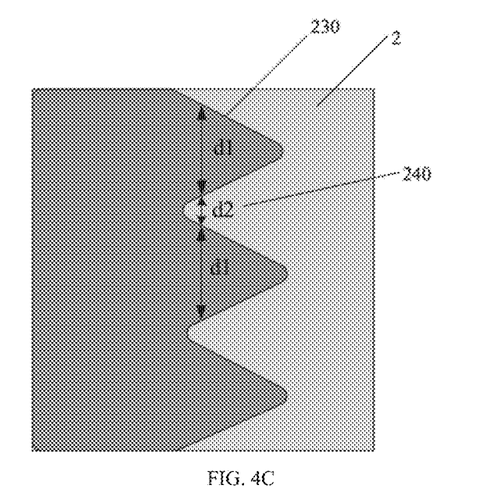
FIGS. 4C to 4E illustrate schematic structural diagrams of a film layer in a transition region of a mask plate according to embodiments of the present disclosure, respectively.

In another embodiment, as shown in FIG. 4C, the plurality of protrusions may include a plurality of first triangles 230, and lines respectively connecting the bases d1 of the plurality of first triangles 210 are on a third straight line; the plurality of recesses may include a plurality of second triangles 240, and lines respectively connecting the bases d2 of the plurality of second triangles 240 are on a fourth straight line; the plurality of first triangles 230 and the plurality of second triangles 240 are alternately arranged and connected in sequence, thereby forming the wave patterns. The third straight line and the fourth straight line may be the same line.

Figure 4D:
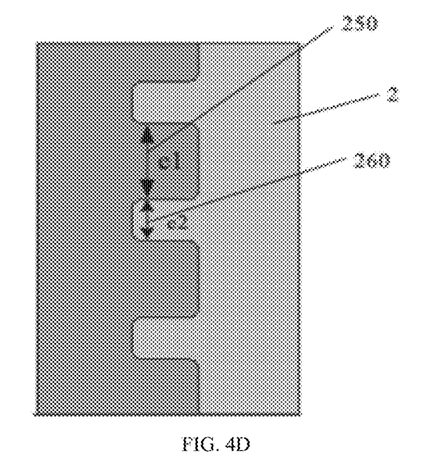

In another embodiment, as shown in FIG. 4D, the plurality of protrusions may include a plurality of first rectangles 250, and lines respectively connecting the bottom edges e1 of the plurality of first rectangles 250 are on a fifth straight line; the plurality of recesses may include a plurality of second rectangles 260, and lines respectively connecting bottom edges e2 of the plurality of second rectangles 260 are on a sixth straight line; the plurality of first rectangles 250 and the plurality of second rectangles 260 are alternately arranged and connected in sequence, thereby forming the wave patterns. The fifth straight line and the sixth straight line may be the same line. For example, FIG. 4F shows a top view of the structure of the mask plate with this configuration, and the wave-like edge of the second transition sub-layer of the transition part 2 in the transition region TR close to the patterning region AR is formed by a plurality of rectangular protrusions protruding toward the patterning region AR and a plurality of rectangular recesses recessed toward the bonding region BR.

Figure 4E:
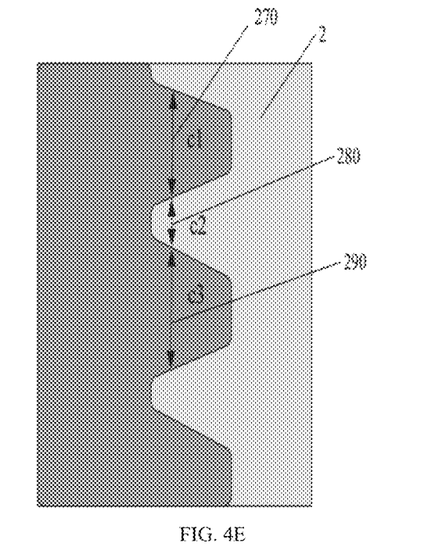
Figure 4F:
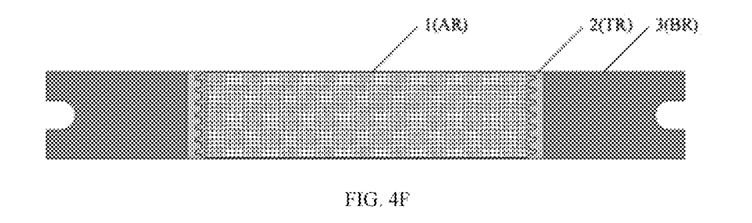
FIGS. 4F and 4G illustrate top views of structures of a mask plate according to embodiments of the present disclosure, respectively.
Figure 4G:
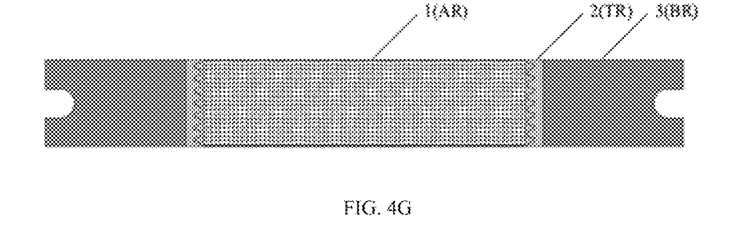

In another embodiment, as shown in FIG. 4E, the plurality of protrusions may include a plurality of first trapezoids 270 and a plurality of third trapezoids 290 alternately arranged, lines respectively connecting bases c1 of the plurality of first trapezoids 270 are on a seventh straight line, and lines respectively connecting bases c3 of the plurality of third trapezoids 290 are on the seventh straight line; the plurality of recesses may include a plurality of second trapezoids 280, and lines respectively connecting bases c2 of the plurality of second trapezoids 280 are on an eighth straight line; the plurality of first trapezoids 270, the plurality of second trapezoids 280 and the plurality of third trapezoids 290 are alternately arranged and connected in sequence to form the wave patterns. The seventh straight line and the eighth straight line may be the same line. For example, FIG. 4G shows a top view of the structure of the mask plate with this configuration, the wave-like edge of the second transition sub-layer of the transition part 2 in the transition region TR close to the patterning region AR is formed by a plurality of trapezoidal protrusions protruding toward the patterning region AR and a plurality of trapezoidal recesses recessed toward the bonding region BR.

Further, the edge of the third transition sub-layer 23 in the transition region close to the patterning region 1 may also be configured to be wave-like like the second transition sub-layer 22, that is, a projection of the inner edge of the third transition sub-layer 23 close to the patterning layer 1 on the first transition sub-layer 21 is farther away from the patterning layer 1 than a projection of the inner edge of the second transition sub-layer 22 close to the patterning layer 1 on the first transition sub-layer 21, and like the projection of the second transition sub-layer 22, the projection of the inner edge is also configured to have the wave patterns as described above, so as to further ensure that the stress is uniform when the mask layer is stretched. Similarly, the fourth transition sub-layer 24 may also be arranged in the same way.

In another aspect, the present disclosure further provides a fabricating method of a mask plate. The mask plate includes a patterning region AR and a bonding region BR arranged on the periphery of the patterning region AR, and a transition region TR between the patterning region AR and the bonding region BR. The fabricating method of the mask plate includes: forming a patterning layer 1 having a plurality of openings in the patterning region AR; forming, in the bonding region BR, a bonding part 3 to be bonded to an external frame; and forming a transition part 2 in the transition region TR, where the transition part 2 adjoins the patterning layer 1 and the bonding part 3, respectively; the thickness of the patterning layer 1 is smaller than the thickness of the bonding part 3, and the thickness of a portion of the transition part 2 in contact with the patterning layer 1 is smaller than the thickness of a portion of the transition part 2 in contact with the bonding part 3.

Both the transition part 2 in the transition region TR and the bonding part 3 in the bonding region BR may have a multi-layer structure. For example, in order to fabricate the mask plate shown in FIGS. 2A and 2B, a fabricating method of a mask plate according to an embodiment of the present disclosure may include: forming a patterning layer 1, a first transition sub-layer of the transition part 2 and a first bonding sub-layer of the bonding part 3; and forming a second transition sub-layer (transition compensation film layer 20) of the transition part 2 and a second bonding sub-layer (bonding compensation film layer 30) of the bonding part 3. The patterning layer 1, the first transition sub-layer of the transition part 2, and the first bonding sub-layer of the bonding part 3 may be formed by using the same electrochemical deposition process, and the second transition sub-layer of the transition part 2 and the second bonding sub-layer of the bonding part 3 may also be formed by using the same electrochemical deposition process.

Figure 5:
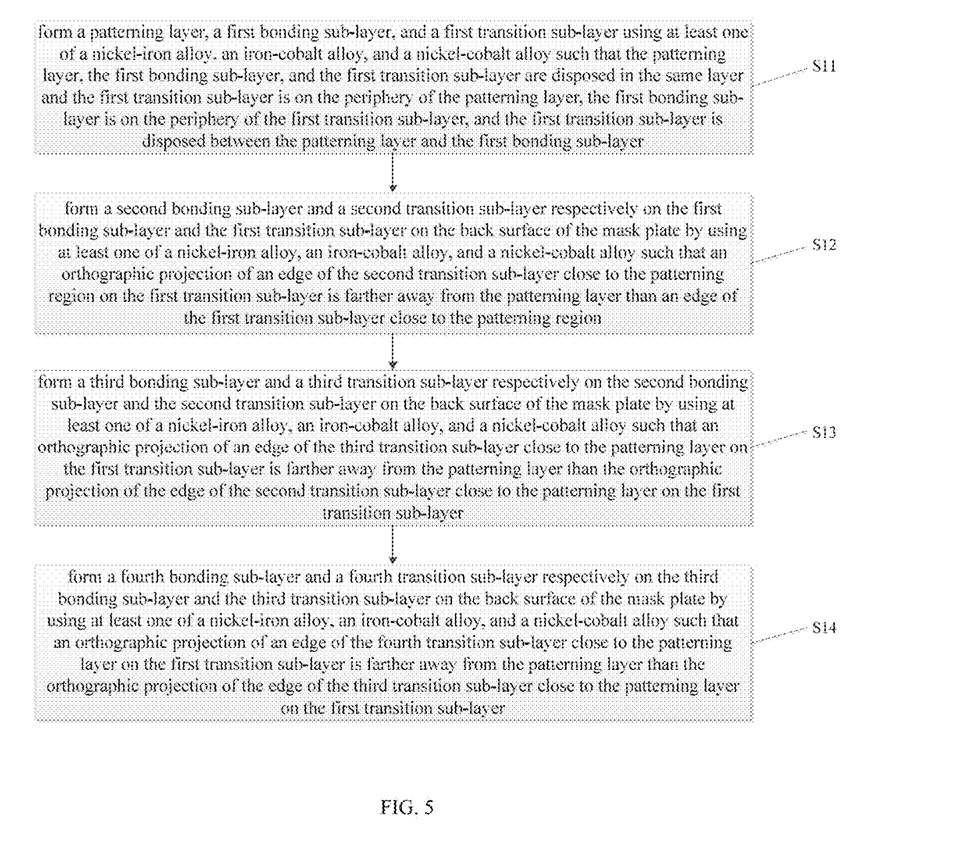
FIG. 5 illustrates a flowchart of a method for manufacturing a mask plate according to an embodiment of the present disclosure.

FIG. 5 illustrates a flowchart of a fabricating method of a mask plate according to an embodiment of the present disclosure, in order to fabricate the mask plate shown in FIG. 3. As shown in FIG. 5, the fabricating method of a mask plate according to the embodiment of the present disclosure includes steps S11 to S14.

In step S11, the patterning layer, the first bonding sub-layer, and the first transition sub-layer are formed using at least one of a nickel-iron alloy, an iron-cobalt alloy, and a nickel-cobalt alloy such that the patterning layer, the first bonding sub-layer, and the first transition sub-layer are disposed in the same layer and the first transition sub-layer is on the periphery of the patterning layer, the first bonding sub-layer is on the periphery of the first transition sub-layer, and the first transition sub-layer is disposed between the patterning layer and the first bonding sub-layer. For example, the patterning layer, the first bonding sub-layer and the first transition sub-layer may be formed at the same time by the same electrochemical deposition process, and of course, the patterning layer, the first bonding sub-layer and the first transition sub-layer may also be formed by three electrochemical deposition processes.

In step S12, a second bonding sub-layer and a second transition sub-layer are respectively formed on the first bonding sub-layer and the first transition sub-layer on the back surface of the mask plate by using at least one of a nickel-iron alloy, an iron-cobalt alloy, and a nickel-cobalt alloy such that an orthographic projection of an edge of the second transition sub-layer close to the patterning region on the first transition sub-layer is farther away from the patterning layer than an edge of the first transition sub-layer close to the patterning region. Similarly, the second bonding sub-layer and the second transition sub-layer may be formed by the same electrochemical deposition process, or the second bonding sub-layer and the second transition sub-layer may be formed by two electrochemical deposition processes.

In step S13, a third bonding sub-layer and a third transition sub-layer are respectively formed on the second bonding sub-layer and the second transition sub-layer on the back surface of the mask plate by using at least one of a nickel-iron alloy, an iron-cobalt alloy, and a nickel-cobalt alloy such that an orthographic projection of the edge of the third transition sub-layer close to the patterning layer on the first transition sub-layer is farther away from the patterning layer than the orthographic projection of the edge of the second transition sub-layer close to the patterning layer on the first transition sub-layer. Similarly, the third bonding sub-layer and the third transition sub-layer may be formed by the same electrochemical deposition process, and of course, the third bonding sub-layer and the third transition sub-layer may be formed by two electrochemical deposition processes.

In step S14, a fourth bonding sub-layer and a fourth transition sub-layer are respectively formed on the third bonding sub-layer and the third transition sub-layer on the back surface of the mask plate by using at least one of a nickel-iron alloy, an iron-cobalt alloy, and a nickel-cobalt alloy such that an orthographic projection of the edge of the fourth transition sub-layer close to the patterning layer on the first transition sub-layer is farther away from the patterning layer than an orthographic projection of the edge of the third transition sub-layer close to the patterning layer on the first transition sub-layer. Similarly, the fourth bonding sub-layer and the fourth transition sub-layer may be formed by the same electrochemical deposition process, and of course, the fourth bonding sub-layer and the fourth transition sub-layer may be formed by two electrochemical deposition processes.

The electrochemical deposition process may include coating a photoresist on a cathode substrate, forming a mother substrate having a photoresist pattern corresponding to a pattern to be formed through a photolithography process; then performing electroforming growth, where the mother substrate is put into an electroforming tank, the anode is made of a metal such as Fe, Ni, Co and the like, a current is applied to the mother substrate, so that the anode is transformed into metal ions, which are dissolved into electrolyte, and the metal ions in the electrolyte are reduced into metal at the cathode and are deposited on the surface of the mother substrate. When the electroformed layer reaches the required thickness, the electrochemical deposition process is completed, and the electroformed layer is peeled off from the mother substrate to obtain a film layer of the electroformed metal mask plate that needs to be fabricated.

In some embodiment of the present disclosure, the transition part and the bonding part each include four sub-layers, and thus, the fabrication of the electroformed metal mask plate of the embodiments requires at least four electrochemical deposition processes, for example, one electrochemical deposition process is used in each of steps S11 to S14 to fabricate the electroformed metal mask plate.

In the mask plate fabricated by using the above method, all transition sub-layers of the transition part are arranged, on the back surface opposite to the front surface of the mask plate, in a step shape sequentially decreasing in a direction from the edge of the patterning layer to the bonding part, and therefore a sudden change in property between film layers of the patterning layer and the bonding part can be relieved. In addition, when forming the transition part, one or more transition sub-layers with a wave-like edge as shown in FIGS. 4A to 4G may be formed to balance the stress generated on the patterning layer, thereby effectively relieving the fold deformation during the stretching.

In the present disclosure, the film layers of the transition region and the welding region of the mask plate are realized by depositing multiple layers, the transition region and the welding region in the embodiment include four film layers, the thickness of each film layer may be in the range of 5 µm to 12 µm, the thickness of the patterning layer of the formed mask plate is in the range of 5 µm to 12 µm, and the thickness of the bonding part of the mask plate is in the range of 15 µm to 25 µm. As such, the thickness of the patterning layer of the obtained mask plate is small, evaporation shadow can be avoided, and the thickness of the bonding part that is at the margin is large, so that the welding reliability and stability can be ensured. However, the present disclosure is not limited thereto and the transition region and the welding region may also include five film layers or even more, depending on the process requirements.

It could be understood that the above embodiments are merely exemplary embodiments employed to illustrate the principle of the present disclosure, and the present disclosure is not limited thereto. It will be apparent to those skilled in the art that various modifications and improvements can be made without departing from the spirit and scope of the present disclosure, and these modifications and improvements are also considered to be within the scope of the present disclosure.

What is claimed is:

1. A mask plate comprising:
   a patterning region comprising a patterning layer having a plurality of openings;
   a bonding region at a periphery of the patterning region and comprising a bonding part configured to be bonded to an external frame; and
   a transition region between the patterning region and the bonding region and comprising a transition part, the transition part adjoining the patterning layer and the bonding part, respectively;
   wherein a thickness of the patterning layer is less than a thickness of the bonding part;
   a thickness of a portion of the transition part adjoining the patterning layer is less than a thickness of a portion of the transition part adjoining the bonding part; and
   the bonding part and the transition part are each of a multi-layer structure.

2. The mask plate of claim 1, wherein the thickness of the transition part increases stepwise in a direction from the patterning region to the bonding region.

3. The mask plate of claim 1, wherein
   the bonding part comprises a first bonding sub-layer and a second bonding sub-layer;
   the transition part comprises a first transition sub-layer and a second transition sub-layer;
   the first bonding sub-layer, the first transition sub-layer, and the patterning layer are flush with each other, and the first transition sub-layer is between and in contact with the first bonding sub-layer and the patterning layer, respectively;
   the second bonding sub-layer and the second transition sub-layer are on one sides of the first bonding sub-layer and the first transition sub-layer, respectively; and
   an orthographic projection, on the first transition sub-layer, of an inner edge of the second transition sub-layer close to the patterning layer is farther away from the patterning layer than an inner edge of the first transition sub-layer close to the patterning layer.

4. The mask plate of claim 3, wherein
   the bonding part further comprises a third bonding sub-layer on a surface of the second bonding sub-layer away from the first bonding sub-layer;
   the transition part further comprises a third transition sub-layer on a surface of the second transition sub-layer away from the first transition sub-layer; and
   an orthographic projection, on the first transition sub-layer, of an inner edge of the third transition sub-layer close to the patterning layer is farther away from the patterning layer than the orthographic projection, on the first transition sub-layer, of the inner edge of the second transition sub-layer close to the patterning layer.

5. The mask plate of claim 4, wherein
   the bonding part further comprises a fourth bonding sub-layer on a surface of the third bonding sub-layer away from the second bonding sub-layer;
   the transition part further comprises a fourth transition sub-layer on a surface of the third transition sub-layer away from the second transition sub-layer; and
   an orthographic projection, on the first transition sub-layer, of an inner edge of the fourth transition sub-layer close to the patterning layer is farther away from the patterning layer than the orthographic projection, on the first transition sub-layer, of the inner edge of the third transition sub-layer close to the patterning layer.

6. The mask plate of claim 5, wherein
   the second bonding sub-layer and the second transition sub-layer are of a single-piece structure;
   the third bonding sub-layer and the third transition sub-layer are of a single-piece structure; and
   the fourth bonding sub-layer and the fourth transition sub-layer are of a single-piece structure.

7. The mask plate of claim 6, wherein
   the thickness of the patterning layer is in the range of 5 µm to 12 µm; and/or
   the thickness of the bonding part is in the range of 15 µm to 25 µm, and the thickness of the portion of the transition part adjoining the bonding part is in the range of 15 µm to 25 µm.

8. The mask plate of claim 7, wherein
   a material of any one of the patterning layer, the first bonding sub-layer, the second bonding sub-layer, the third bonding sub-layer, the fourth bonding sub-layer, the first transition sub-layer, the second transition sub-layer, the third transition sub-layer, and the fourth transition sub-layer is at least one of a nickel-iron alloy, an iron-cobalt alloy, and a nickel-cobalt alloy.

9. The mask plate of claim 5, wherein an inner edge of the third transition sub-layer and/or an inner edge of the fourth transition sub-layer has a plurality of protrusions protruding towards the patterning region and a plurality of recesses recessed towards the bonding region.

10. A fabricating method of a mask plate, the mask plate being the mask plate of claim 5, the method comprising:
    forming the patterning layer, the first bonding sub-layer, and the first transition sub-layer by a same electrochemical deposition process;
    forming the second bonding sub-layer and the second transition sub-layer by a same electrochemical deposition process;
    forming the third bonding sub-layer and the third transition sub-layer by a same electrochemical deposition process; and
    forming the fourth bonding sub-layer and the fourth transition sub-layer by a same electrochemical deposition process.

11. The mask plate of claim 3, wherein the inner edge of the second transition sub-layer has a plurality of protrusions protruding toward the patterning region and a plurality of recesses recessed toward the bonding region.

12. The mask plate of claim 11, wherein
the plurality of protrusions comprise a plurality of first semicircles, and lines respectively connecting diameters of the plurality of first semicircles are on a first straight line;
the plurality of recesses comprise a plurality of second semicircles, and lines respectively connecting diameters of the plurality of second semicircles are on a second straight line; and
the plurality of first semicircles and the plurality of second semicircles are alternately arranged and connected in sequence.

13. The mask plate of claim 12, wherein
the first straight line and the second straight line are a same line; and
the diameter of the first semicircle is 1.7 to 2 times the diameter of the second semicircle.

14. The mask plate of claim 13, wherein
the diameter of the first semicircle is in the range of 200 μm to 400 μm.

15. The mask plate of claim 11, wherein
the plurality of protrusions comprise a plurality of first triangles or trapezoids, and lines respectively connecting bases of the plurality of first triangles or trapezoids are on a first straight line;
the plurality of recesses comprise a plurality of second triangles or trapezoids, and lines respectively connecting bases of the plurality of second triangles or trapezoids are on a second straight line; and
the plurality of first triangles or trapezoid and the plurality of second triangles or trapezoids are alternately arranged and connected in sequence.

16. A fabricating method of a mask plate, the mask plate being the mask plate of claim 3, the method comprising:
forming the patterning layer, the first bonding sub-layer, the first transition sub-layer by a same electrochemical deposition process; and
forming the second bonding sub-layer and the second transition sub-layer by a same electrochemical deposition process.

17. A fabricating method of a mask plate, the mask plate being the mask plate of claim 1, the method comprising:
forming the patterning layer having a plurality of openings in the patterning region;
forming, in the bonding region, the bonding part configured to be bonded to an external frame; and
forming the transition part in the transition region, the transition part adjoining the patterning layer and the bonding part, respectively;
wherein the thickness of the patterning layer is less than the thickness of the bonding part;
the thickness of the portion of the transition part adjoining the patterning layer is less than the thickness of the portion of the transition part adjoining the bonding part; and
the bonding part and the transition part are each of a multi-layer structure.

* * * * *